(12) United States Patent
Schmidt et al.

(10) Patent No.: US 8,465,801 B2
(45) Date of Patent: Jun. 18, 2013

(54) GAS MIXER AND MANIFOLD ASSEMBLY FOR ALD REACTOR

(75) Inventors: Ryan M. Schmidt, Mesa, AZ (US); Mohith Verghese, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 768 days.

(21) Appl. No.: 12/398,938

(22) Filed: Mar. 5, 2009

(65) Prior Publication Data
US 2009/0196992 A1 Aug. 6, 2009

Related U.S. Application Data

(62) Division of application No. 10/929,348, filed on Aug. 30, 2004.

(60) Provisional application No. 60/499,045, filed on Aug. 29, 2003.

(51) Int. Cl.
*C23C 16/00* (2006.01)

(52) U.S. Cl.
USPC ...................................................... 427/248.1

(58) Field of Classification Search
USPC .......................... 427/248.1; 118/715, 728, 50
See application file for complete search history.

(56) References Cited

U.S. PATENT DOCUMENTS

| | | | |
|---|---|---|---|
| 4,907,534 A | 3/1990 | Huang et al. | |
| 5,166,092 A | 11/1992 | Mochizuki et al. | |
| 5,248,253 A | 9/1993 | Culley et al. | |
| 5,284,519 A | 2/1994 | Gadgil | |
| 5,288,327 A | 2/1994 | Bhat et al. | |
| 5,350,453 A | 9/1994 | Schlosser | |
| 5,601,651 A | 2/1997 | Watabe | |
| 5,728,223 A * | 3/1998 | Murakami et al. | 118/715 |
| 5,789,027 A | 8/1998 | Watkins et al. | |
| 6,070,550 A | 6/2000 | Ravi et al. | |
| 6,079,353 A | 6/2000 | Leksell et al. | |
| 6,114,227 A | 9/2000 | Leksell et al. | |
| 6,303,501 B1 | 10/2001 | Chen et al. | |
| 6,916,398 B2 | 7/2005 | Chen et al. | |
| 2001/0003015 A1 | 6/2001 | Chang et al. | |
| 2002/0007790 A1 * | 1/2002 | Park | 118/715 |
| 2002/0072164 A1 | 6/2002 | Umotoy et al. | |
| 2002/0081381 A1 | 6/2002 | DeLaRosa et al. | |
| 2003/0056720 A1 * | 3/2003 | Dauelsberg et al. | 117/200 |

FOREIGN PATENT DOCUMENTS

| DE | 3715644 | 1/1988 |
|---|---|---|
| WO | WO 90/10092 | 9/1990 |

* cited by examiner

*Primary Examiner* — Kelly M Gambetta
(74) *Attorney, Agent, or Firm* — Knobbe Martens Olson & Bear LLP

(57) ABSTRACT

A system and method for mixing a plurality of gases for an atomic layer deposition (ALD) reactor. The mixer is configured to mix the plurality of gases while minimizing the potential for re-circulation within the mixer. The mixer is further configured to maintain the flow velocity of the plurality of gases as the gases pass through the mixer.

20 Claims, 12 Drawing Sheets

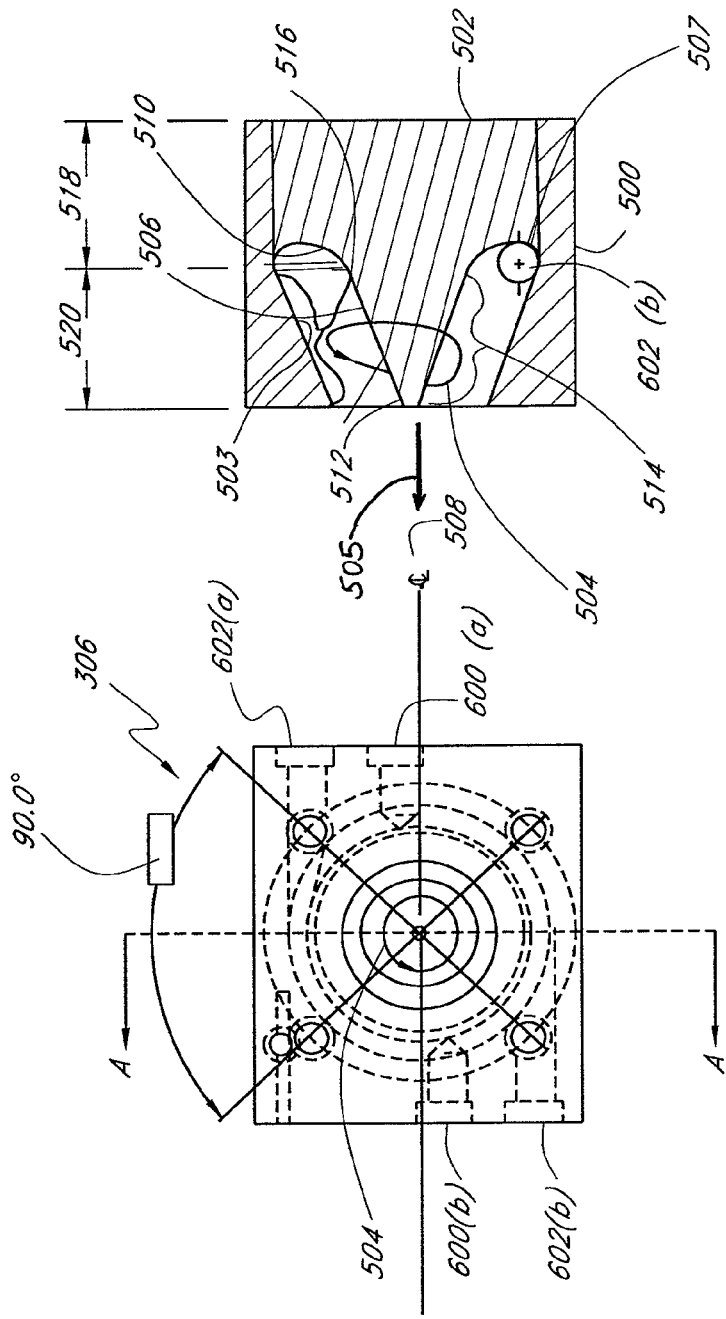

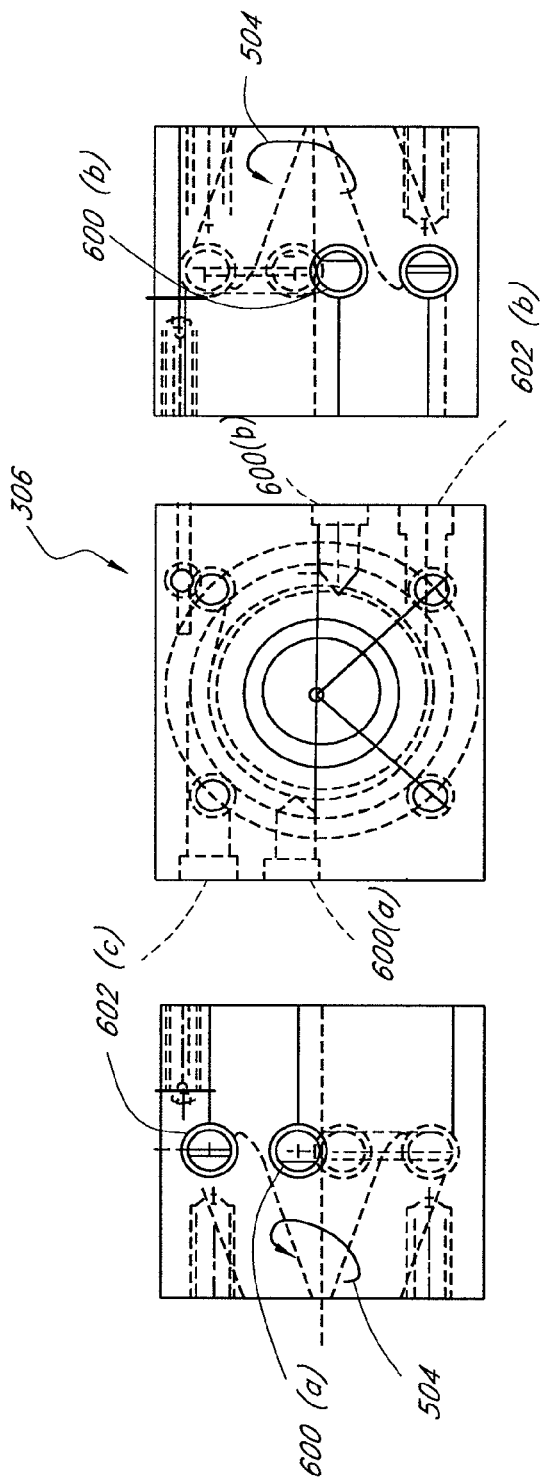

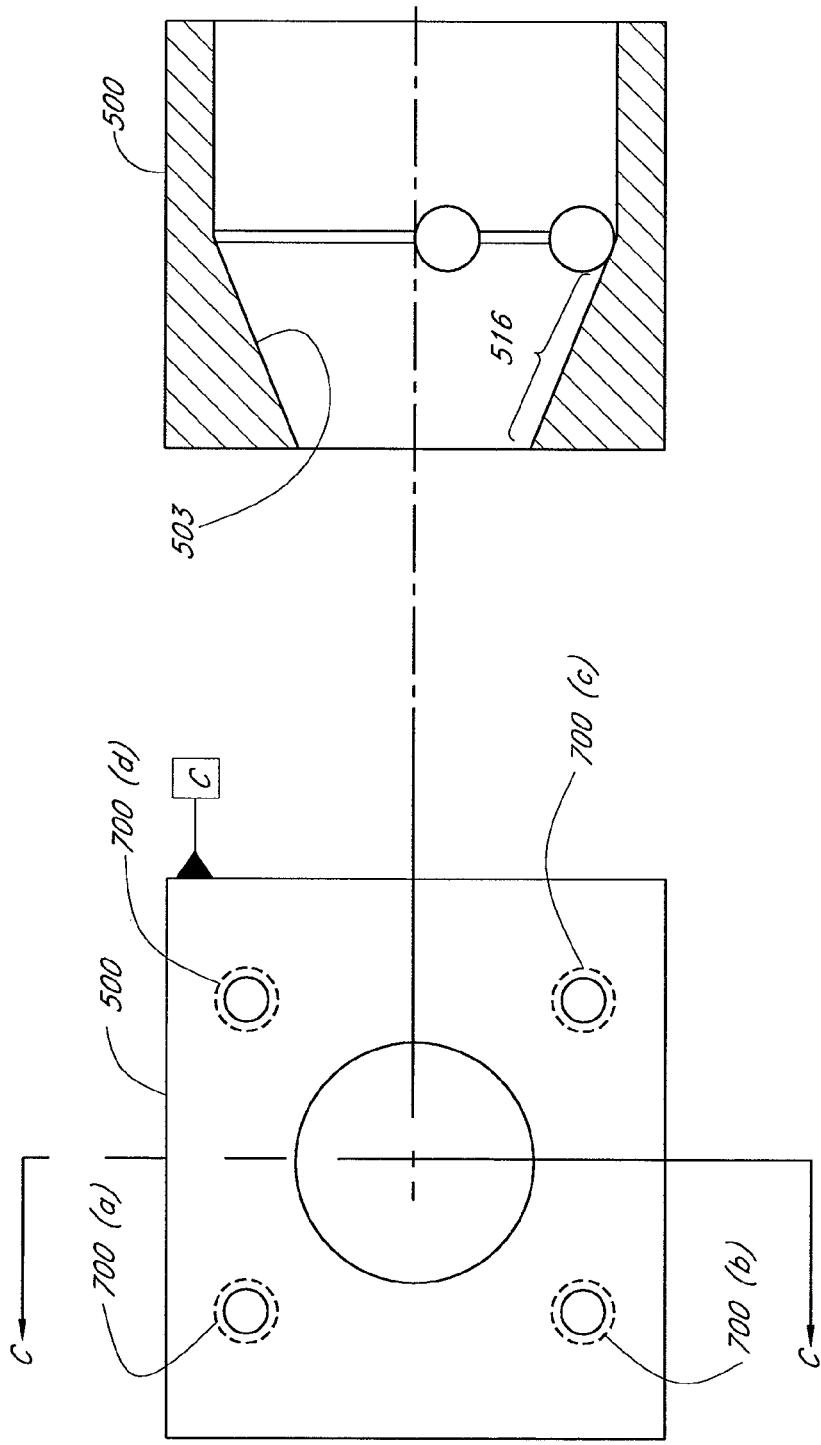

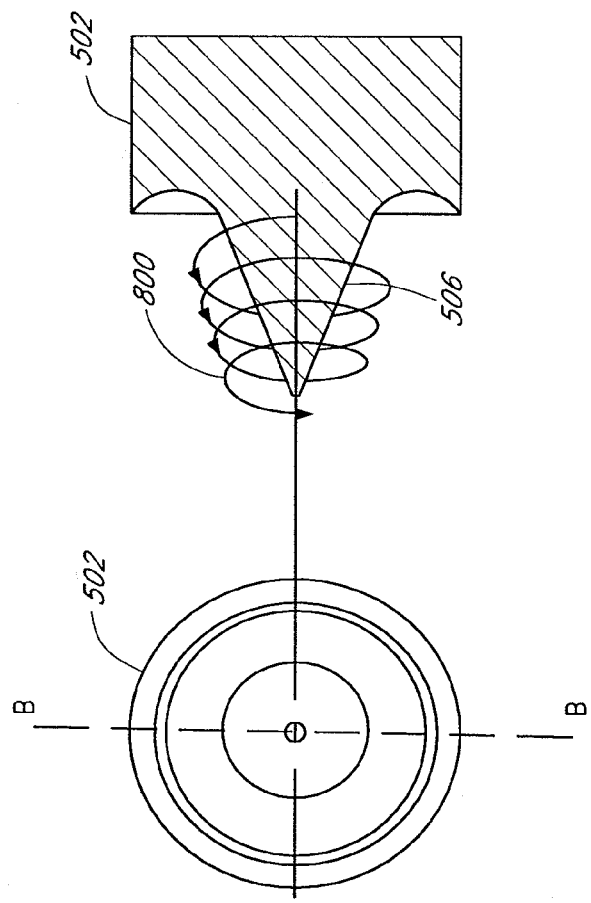

Section X-X

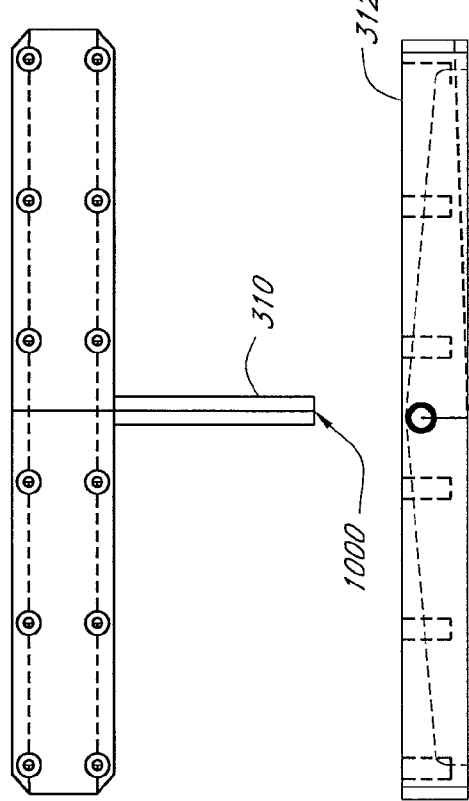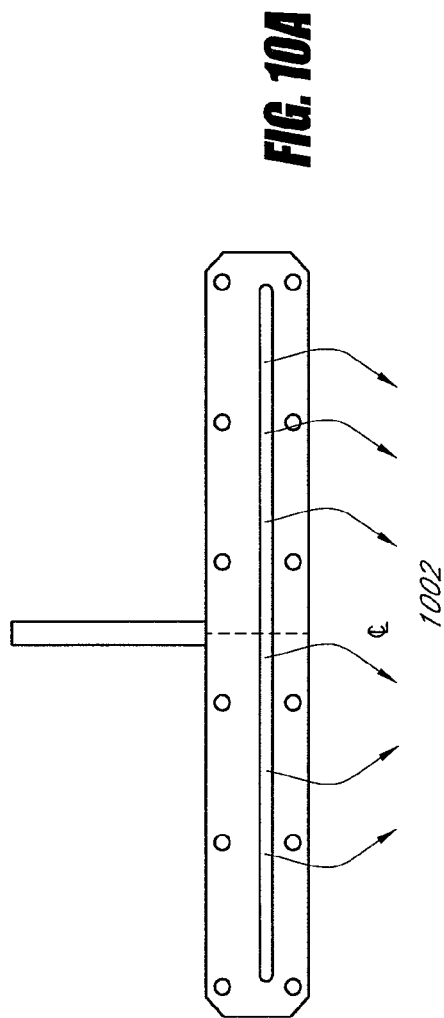

GAS MIXER AND MANIFOLD ASSEMBLY FOR ALD REACTOR

RELATED APPLICATIONS

This application is a divisional of U.S. application patent Ser. No. 10/929,348 entitled GAS MIXER AND MANIFOLD ASSEMBLY FOR ALD REACTOR, filed Aug. 30, 2004, which claims priority under 35 U.S.C. §119(e) to Provisional Application No. 60/499,045 entitled GAS MIXER AND MANIFOLD ASSEMBLY FOR ALD REACTOR, filed on Aug. 29, 2003, the disclosures of both of which are hereby incorporated by reference in their entireties.

BACKGROUND OF THE INVENTION

1. Field of the Invention

The present invention generally relates to a mixer and a manifold assembly for an atomic layer deposition (ALD) reactor. More specifically, the present invention relates to a mixer for improving the mixing of gases flowing through the ALD reactor and a manifold assembly to efficiently deliver the gases to the ALD reactor.

2. Description of the Related Art

Atomic layer deposition (ALD) is a well known process in the semiconductor industry for forming thin films of materials on substrates such as silicon wafers. ALD is a type of vapor deposition wherein a film is built up through deposition of multiple ultra-thin layers with the thickness of the film being determined by the number of layers deposited. In an ALD process, gaseous molecules of one or more compounds (precursors) of the material to be deposited are supplied to the substrate or wafer to form a thin film of that material on the wafer. In one pulse, a first precursor material is adsorbed largely intact in a self-limiting process on the wafer. The precursor material may be decomposed in a subsequent reactant pulse to form a single molecular layer of the desired material. Alternatively, the adsorbed precursor material may react with the reactant of a subsequent reactant pulse to form a single molecular layer of a compound. Thicker films are produced through repeated growth cycles until the target thickness is achieved.

In an ALD process, one or more substrates with at least one surface to be coated are introduced into the reactor or deposition chamber. The wafer is heated to a desired temperature above the condensation temperature but below the thermal decomposition temperature of the selected vapor phase reactants. One reactant is capable of reacting with the adsorbed species of a prior reactant to form a desired product on the substrate surface. The product can be in the form of a film, liner, or layer.

During an ALD process, the reactant pulses, all of which are typically in vapor or gaseous form, are pulsed sequentially into the reactor with removal steps between reactant pulses. For example, inert gas pulses are provided between the pulses of reactants. The inert gas purges the chamber of one reactant pulse before the next reactant pulse to avoid gas phase mixing or CVD type reactions. A characteristic feature of ALD is that each reactant is delivered to the substrate until a saturated surface condition is reached. The cycles are repeated to form an atomic layer of the desired thickness. To obtain a self-limiting growth, sufficient amount of each precursor is provided to saturate the substrate. As the growth rate is self-limiting, the rate of growth is proportional to the repetition rate of the reaction sequences rather than to the flux of reactant as in CVD.

The use of a pre-reaction chamber arranged upstream of the deposition or reactor chamber to reduce the residue of a preceding reactant during ALD processing is disclosed in U.S. patent publication number 2002/0108570, published on Aug. 15, 2002, the disclosure of which is incorporated herein by reference.

SUMMARY OF THE INVENTION

The systems and methods of the present invention have several features, no single one of which are solely responsible for its desirable attributes. Without limiting the scope of this invention as expressed by the claims which follow, its more prominent features will now be discussed briefly. After considering this discussion, and particularly after reading the section entitled "Detailed Description of the Preferred Embodiments," one will understand how the features of this invention provide several advantages over traditional ALD mixing methods and systems.

One aspect is a mixer for mixing a reactant gas with a buffer gas in a reactor. The mixer comprises a housing, a chamber located within the housing, the chamber having a flow axis through the housing, and an outlet port from the chamber, the outlet port being aligned with the flow axis. The mixer further comprises a first port into the chamber, the first port being aligned at an angle of at least 45 degrees relative to the flow axis and a second port into the chamber, the second port being aligned at an angle of at least 45 degrees relative to the flow axis.

Another aspect is a mixer for receiving pulses of gas for use during atomic layer deposition (ALD). The mixer comprises a housing having a first inlet, a second inlet, and enclosing means for mixing the received pulses of gas passing along a flow axis, wherein the first and second inlets are aligned tangential to the flow axis.

Still another aspect is an atomic layer deposition (ALD) thin film deposition apparatus. The apparatus comprises a housing, a chamber located within the housing and having a flow axis through the housing, and a reactor in flow communication with the chamber and configured to deposit a thin film on a wafer mounted therein. The apparatus further comprises a first reactant gas line configured to supply a first reactant gas to the chamber at an angle relative to the flow axis, a second reactant gas line configured to supply a second reactant gas to the chamber at an angle relative to the flow axis and a first buffer gas line in flow communication with the second reactant gas line at a first coupling and configured to supply a first portion of a first buffer gas to the chamber via the second reactant gas line, wherein the first buffer gas selectively impedes the second reactant gas from reaching the chamber.

Yet another aspect is a housing for mixing a first gas with a second gas in a vapor deposition reactor. The housing comprises an upstream member that comprises an insert member having a base, a distal end located downstream of the base, and a first mixing surface located between the base and the distal end, a second mixing surface located parallel to a portion of the first mixing surface and a trough circumscribing the base and forming a transition surface between the first and second mixing surfaces. The insert further comprises an inlet and a downstream member in flow communication with the upstream member and having a generally tapering inner surface, the first and second mixing surfaces, the trough, and the tapering inner surface together forming at least a portion of a chamber.

Another aspect is a method of performing atomic layer deposition (ALD) in a reactor. The method comprises flowing a first reactant gas through a first reactant gas line and towards a housing having a first generally tapering surface, flowing a second reactant gas through a second reactant gas line and towards the housing, flowing a buffer gas through a buffer gas line and into the first reactant gas line, and forming a first gas buffer in the first reactant gas line to prevent the first reactant gas from reaching the housing. The method further comprises mixing the second reactant gas with a first portion of the buffer gas in the housing to form a mixture, swirling the mixture in the housing, and flowing the mixture into a deposition chamber.

Still another aspect is a gas distribution system for use with an Atomic Layer Deposition (ALD) chamber. The gas distribution system comprises a first reactant line, a second reactant line, a housing communicating with the first and second reactant lines and a source of inert gas, and configured to form a mixture by swirling a reactant gas from the second reactant line with a buffer gas from the first buffer line, and a transfer tube in flow communication with the housing and configured to collect the mixture. The gas distribution system further comprises an intake plenum in flow communication with the transfer tube and configured to distribute the mixture into a deposition chamber and an exhaust launder communicating with the deposition chamber and configured to collect and exhaust the mixture from the deposition chamber.

A further aspect is a mixer for mixing a reactant gas with a buffer gas in an atomic layer deposition (ALD) reactor. The mixer comprises a housing with a first inner surface, an insert located within the housing and having a transition surface between the outer surface and the first inner surface, wherein a portion of the insert has a generally tapering cross-section, a mixing chamber formed between the generally tapering cross-section, the first inner surface, and the trough, a first inlet passing through the housing and configured to couple the mixing chamber with a first reactant gas line, and a second inlet passing through the housing and configured to couple the mixing chamber with a second reactant gas line.

BRIEF DESCRIPTION OF THE DRAWINGS

FIG. 5A is a rear view of the upstream member from FIG. 4 and illustrates a circular flow path through the upstream member.

FIG. 5B is a side cross-sectional view taken along lines A-A of FIG. 5A, showing an outer housing and an inner insert.

FIG. 6A is a front view of the upstream member showing the inner gas inlets and the outer gas inlets.

FIG. 6B is a side view of the upstream member.

FIG. 6C is another side view of the upstream member.

FIG. 7A is a rear view of the housing from FIG. 5B with the insert removed.

FIG. 7B is a cross-sectional view taken along lines C-C of FIG. 7A.

FIG. 8A is a front view of the insert from FIG. 5B.

FIG. 8B is a cross-sectional view taken along lines B-B of FIG. 8A and illustrates a circular flow path around a cone portion of the insert.

FIG. 10A is bottom view of a transfer tube and the intake plenum from FIG. 3 illustrating the gas entering the transfer tube and exiting from the intake plenum.

FIG. 10B is a front view of the transfer tube and the intake plenum from FIG. 10A.

FIG. 10C is a top view of the transfer tube and the intake plenum from FIG. 10A.

DETAILED DESCRIPTION OF THE PREFERRED EMBODIMENTS

These and other features, aspects and advantages of the present invention will now be described with reference to the drawings of several preferred embodiments, which embodiments are intended to illustrate and not to limit the invention.

Despite the fact that ALD is prized for self-limiting reactions and thus perfectly conformal depositions without perfectly uniform conditions, various process parameters must be carefully controlled to ensure a high quality of layers resulting from ALD. Surprisingly, it has been found that if the reactant of each pulse is not adequately mixed with the inert gas, uneven deposition of the gases occurs and the physical properties will not be uniform over the wafer. Furthermore, dead zones along the flow path can cause the reactant gases to re-circulate upstream of the deposition chamber. If the reactant gases are not efficiently purged, it can lead to one precursor being present when the other precursor is pulsing, leading to gas phase CVD reactions instead of surface ALD reactions.

Figure 1A:
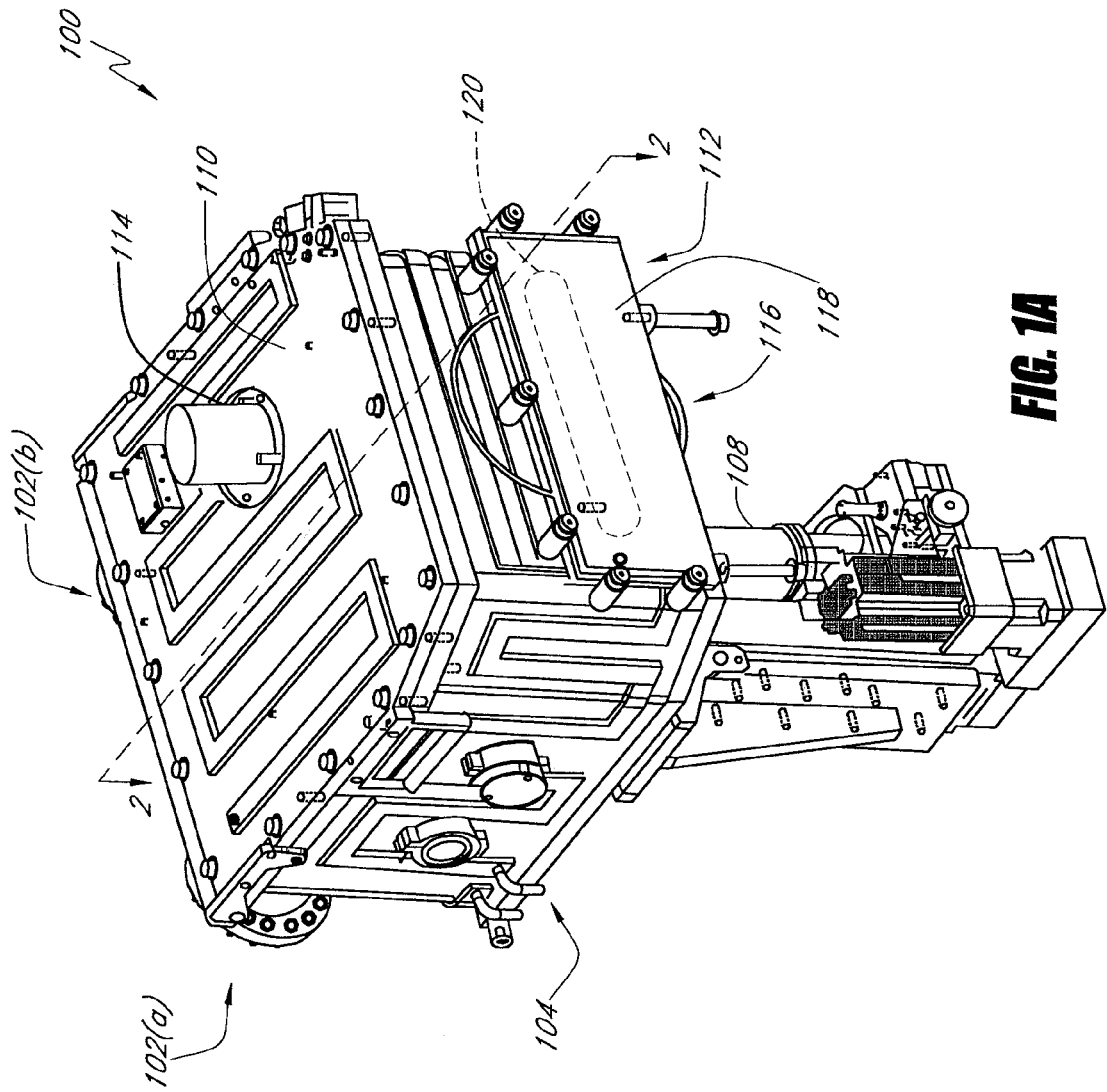
FIG. 1A is front, top and left side a perspective view of an atomic layer deposition (ALD) device.

FIG. 1A is a perspective view of an ALD device 100. The ALD device 100 comprises a top member 110, a bottom member 112, and a front member 118 which together form a portion of a housing for the ALD device 100. In the embodiment illustrated in FIG. 1A, an upper heater 114 extends through the top member 110. The upper heater 114 is configured to maintain the temperature in the upper portion of the ALD device 100. Similarly, a lower heater 116 extends through the bottom member 112. The lower heater is configured to maintain the temperature in the lower portion of the ALD device 100.

The front member 118, which serves as a gate valve, of the ALD device 100 covers an opening 120. A dashed line outlines the opening 120 in FIG. 1A. Once the front member 118 is removed, the opening 120 can receive a wafer to be processed by the ALD device 100. In this way, the received wafer is placed in a deposition chamber within the ALD device 100. Once processing is complete, the wafer can be removed from the deposition chamber via the same opening 120.

An ALD control system (not shown) is configured to control the ALD device 100 during processing of the wafer. For example, the ALD control system can include a computer control system and electrically controlled valves to control the flow of reactant and buffer gases into and out of the ALD device 100. The ALD control system can include modules such as a software or hardware component, such as a FPGA or ASIC, which performs certain tasks. A module may advantageously be configured to reside on the addressable storage medium of the computer control system and be configured to execute on one or more processors.

Figure 1B:
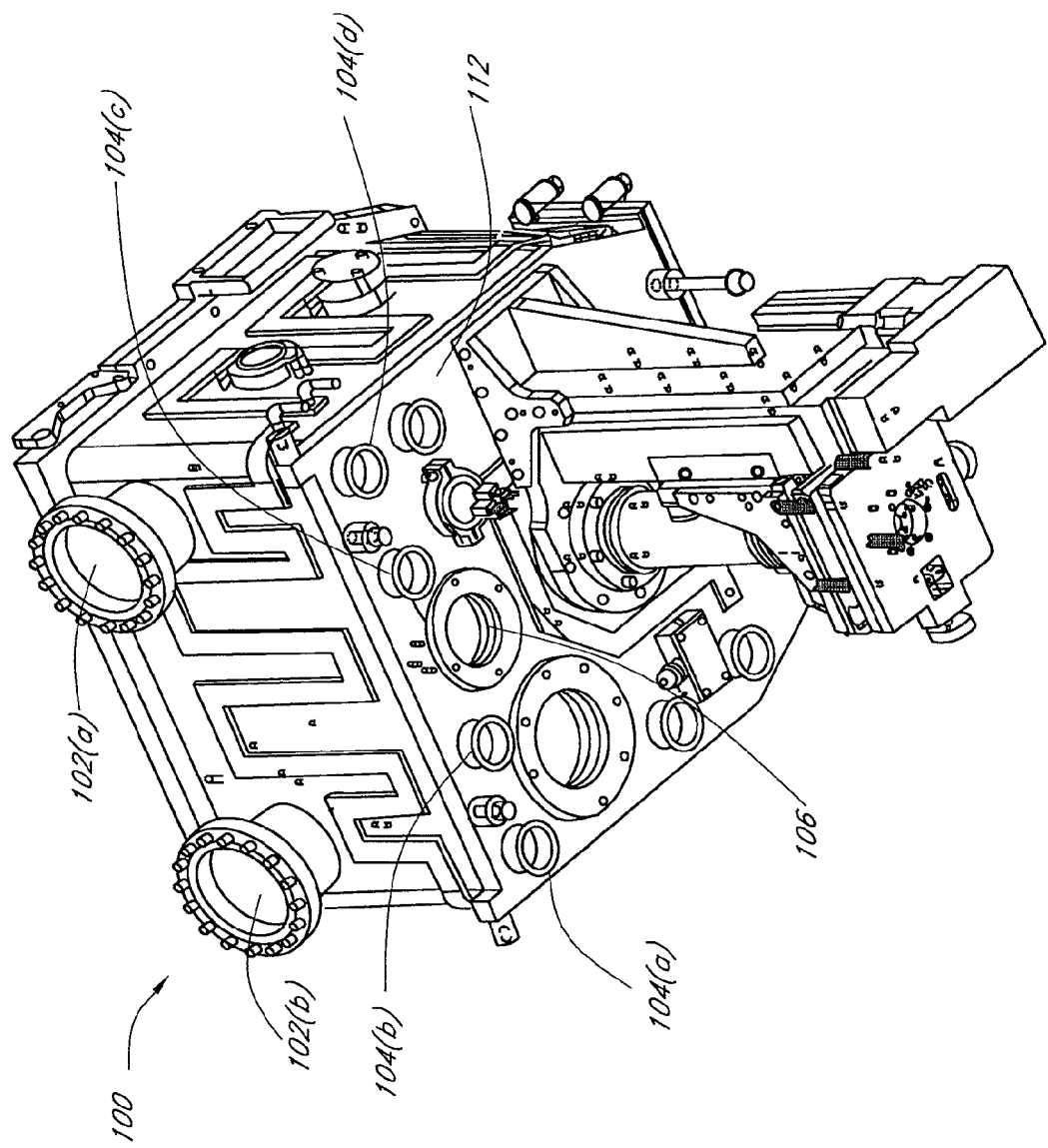
FIG. 1B is a bottom, back and left side perspective view of the ALD device from FIG. 1A.

FIG. 1B is a perspective view of the ALD device 100 showing the bottom member 112. The ALD device 100 further comprises couplings 102(a), 102(b) and couplings 104(a)-(d). In this exemplary configuration, ALD device 100 includes four separate reactant vapor sources. Two of these reactant vapor sources are connected to the ALD device 100 via couplings 102(a), 102(b). These gas sources can be pressurized or not. These vapor sources can be, for example, solid sublimation vessels, liquid bubblers or gas bombs. The third and fourth reactant vapor sources are connected to the ALD device 100 via couplings 104(b), 104(c).

Each reactant vapor source has an associated inert gas source which is used to purge the reactant vapor lines after pulsing the reactant. For example, the inert gas sources that are associated with the reactant vapor sources connected to couplings 102(a) and 102(b) are connected to couplings 104(a) and 104(d), respectively. The inert gas sources associated with the reactant vapor sources connected to couplings 104(b) and 104(c) are also connected to couplings 104(b) and 104(c), respectively. These inert gas sources can be pressurized or not. These inert gas sources can, be, for example, noble or nitrogen gas sources. The ALD control system (not shown) controls one or more valves to selectively allow or prevent the various gases from reaching the ALD device 100.

The ALD device 100 is configured to deposit a thin film on the wafer when the wafer is inserted in the deposition chamber. In general, the ALD device 100 receives a first reactant gas via one of the couplings 102(a), 102(b) or one of the couplings 104(b), 104(c). The ALD device 100 also receives inert gas via the couplings 104(a)-104(d). The inert gas enters the deposition chamber with the first reactant gas to adsorb no more than a monolayer of the first reactant on the wafer. By switching the appropriate valves (not shown), the flow of the first reactant gas is stopped via an inert gas valving (IGV) arrangement and the deposition chamber and the gas lines are then purged with the inert gas from couplings 104(a), 104(b), 104(c), and 104(d). After the deposition chamber and gas lines are purged, the deposition cycle is continued with one or more of the other reactant gases. The reactants from alternated pulses react with each other on the substrate or wafer surface to form no more than a single monolayer of the desired product in each cycle. It should be noted that variation of true ALD operation can increase deposition speed above one monolayer per cycle with some sacrifice to uniformity.

In embodiments of the ALD device 100, more than two reactant gases are sequentially flowed (separated by periods of purging) through the ALD device 100 in each cycle to form compound materials on the wafer. Excess of each reactant gas is subsequently exhausted via gas exit 106 (FIG. 1B) after adsorbing or reacting in the deposition chamber. The gas exit 106 may be connected to a vacuum pump to assist in the removal of the gases from the deposition chamber and provide a low pressure condition in the deposition chamber. Furthermore, the entire ALD device 100 can be pumped down to a low pressure by connecting any of the other couplings on the bottom member 112 to a vacuum pump.

Figure 2:
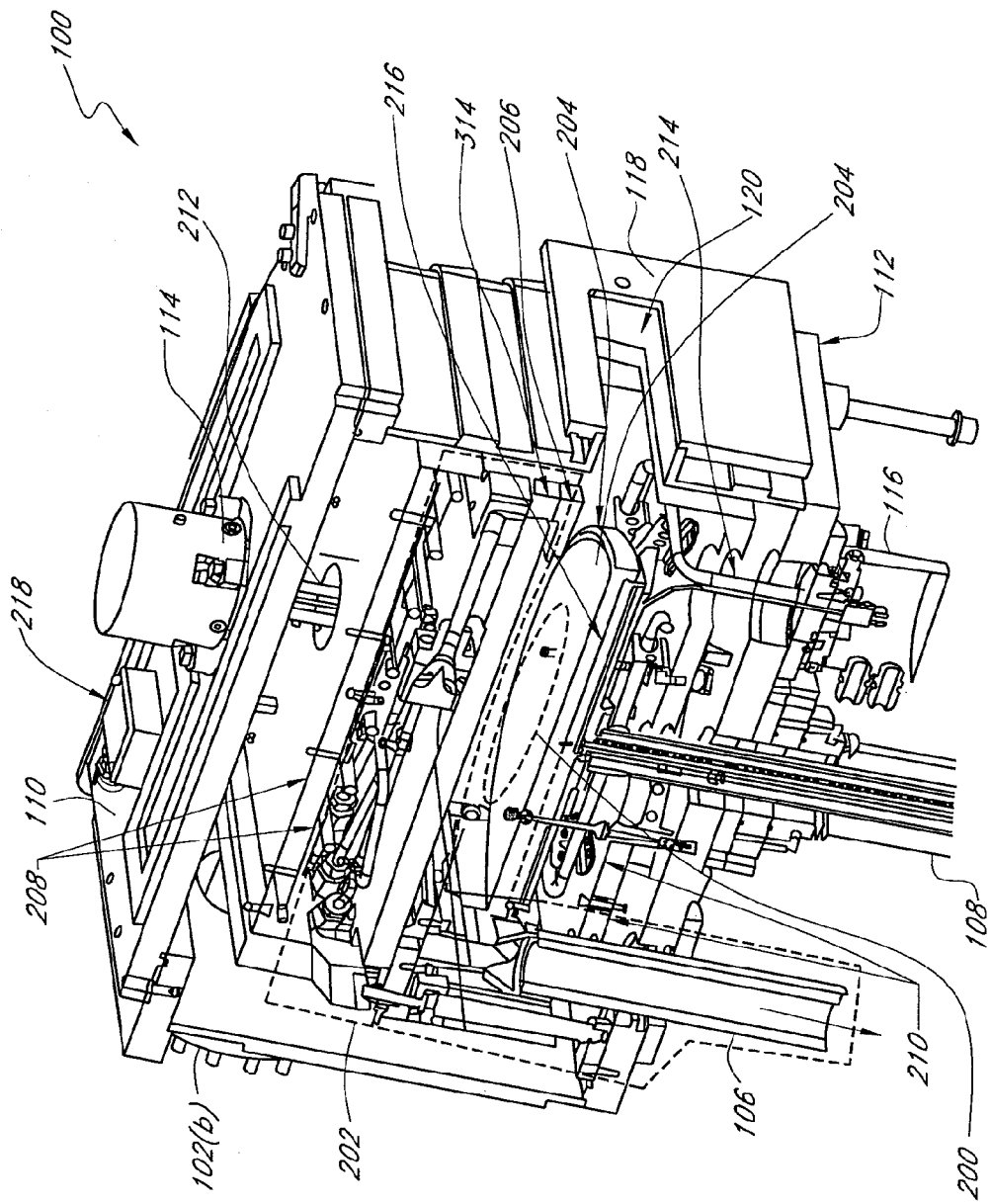
FIG. 2 is a cut-away perspective of the ALD device of FIG. 1, cut along lines 2-2.

FIG. 2 is a cut-away section view of the ALD device 100 from FIG. 1A taken along line 2-2. Within the ALD device 100 is a gas distribution system 202 and a deposition chamber 200. A dashed line circumscribes the gas distribution system 202. Located on upper and lower sides of the gas distribution system 202 and the deposition chamber 200 are one or more reflector plates 208, 210. The ALD device 100 further includes a wafer support 204, a wafer support heater 216, and a thermal switch 218.

The wafer support 204 is located within the ALD device and is configured to support a substrate or wafer during the deposition process. The wafer support 204 can be adapted to rotate within the deposition chamber 200. The wafer support heater 216 is configured to heat the wafer support 204. The thermal switch 218 is provided on the top member 110. The thermal switch 218 is configured to monitor the temperature of the top member 110. It will be understood that the system 100 includes other temperature sensor and control mechanisms to maintain various surfaces of the system at desired temperatures.

The upper reflector plates 208 provide a thermal barrier between the upper portion of the gas distribution system 202 and the top member 110. Similarly, lower reflector plates 210 provide a thermal barrier between the lower portion of the deposition chamber 200 and the bottom member 112. The reflector plates 208 and 210 are also used to assist in radiatively heating the deposition chamber within a low pressure environment. As illustrated in FIG. 2, the upper heater 114 is coupled to coils 212 which extend through the upper reflector plates 208. The coils 212 are configured to provide heat through radiation to the upper portion of the gas distribution system 202. Similarly, the lower heater 116 is coupled to coils 214 which extend through the lower reflector plates 210 and heat the lower portion of the deposition chamber 200. Alternatively, other heating systems can be employed.

The gas distribution system 202 is configured to route reactant gases entering via the couplings 102(a), 102(b), 104(b), 104(c) and inert gases entering via couplings 104(a)-(d) through the ALD device 100 (see FIG. 1B). The gas distribution system 202 is further configured to selectively mix one or more of the inert gases entering via couplings 104(a)-(d) with one of reactant gases entering via couplings 102(a), 102(b), 104(b), 104(c) during a given pulse. The resulting mixture enters the deposition chamber 200. After each pulse, the gas distribution system 202 exhausts any unreacted reactant and inert gases from the deposition chamber via gas exit 106, such as through purging. The term coupling is used to describe a gas flow connection between one or more gas lines. The locations of the couplings shown herein are for illustrative purposes only and can be located at different locations along a gas line. Moreover, a gas line associated with a given coupling can be configured to flow gas into or out of the gas distribution system 202. As will be described below, the various couplings in the exemplary embodiments described herein are designated to flow gases into or out of the gas distribution system 202. However, the invention is not limited to the exemplary embodiments disclosed herein.

The order that the reactant gases are cycled through the ALD device 100 depends on the desired product. To minimize any interaction between one or more reactant gases prior to each gas entering the deposition chamber 200, the inert gas entering via couplings 104(a)-(d) is periodically cycled or continuously flowed through the ALD device 100 between pulses of the reactant gases. In this way, the inert gases purge the deposition chamber 200. As will be explained below, various reactant gases and inert gases are systematically cycled through the ALD device 100 so as to form a deposit on the wafer inserted through the opening 120.

Figure 3:
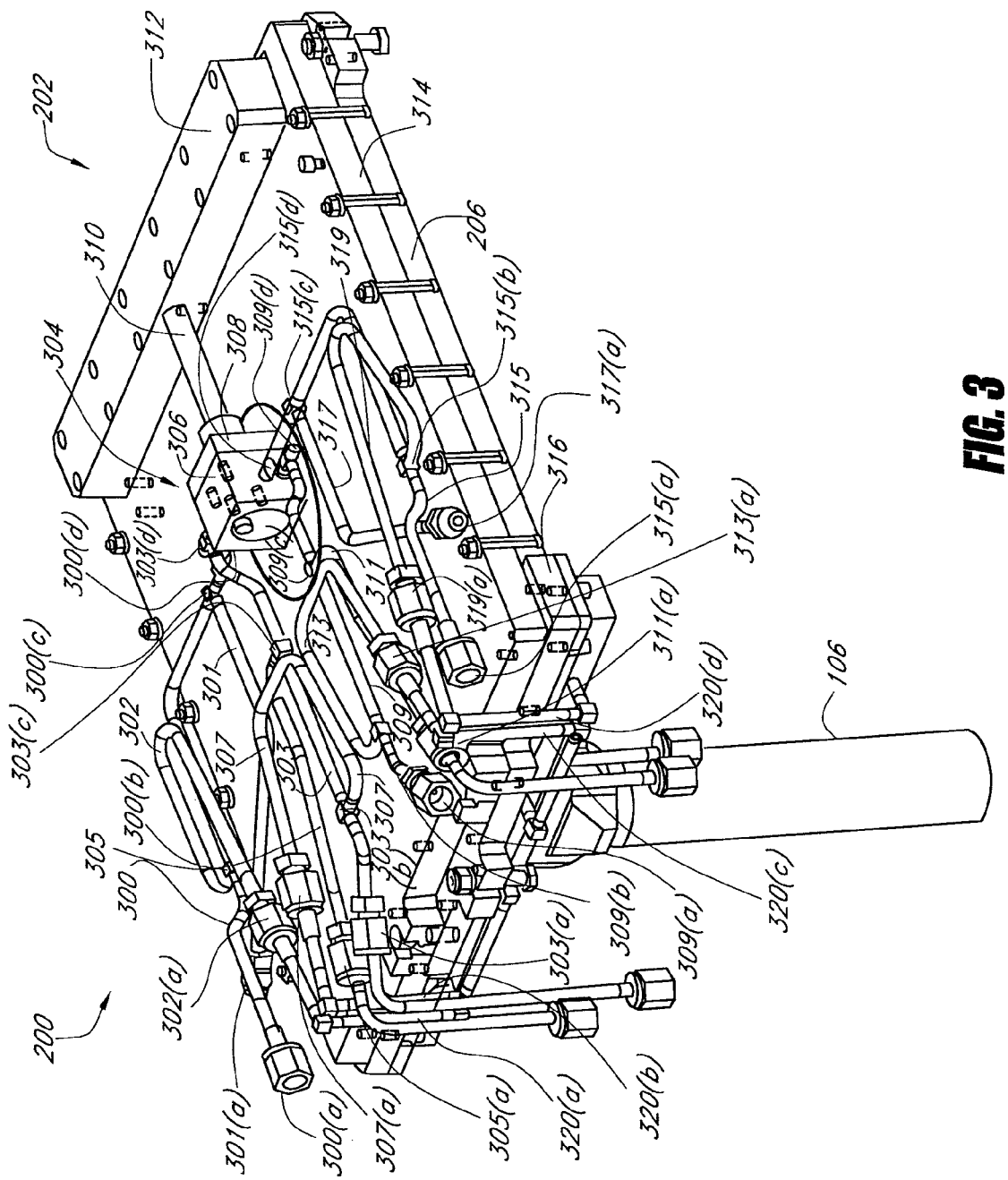
FIG. 3 is a perspective view of the gas distribution system within the ALD device of FIG. 1A (partially visible in FIG. 2).

FIG. 3 is a perspective view of the deposition chamber 200 and the gas distribution system 202 from the ALD device 100 of FIG. 1A. The gas distribution system 202 comprises a plurality of gas lines, a mixer assembly 304, a transfer tube 310, and an intake plenum or manifold 312. The deposition chamber 200 includes a cover plate 314, a base plate 206, and an exhaust launder 316. The gas distribution system 202 is connected to the deposition chamber 200 at the intake plenum 312.

Figure 4:
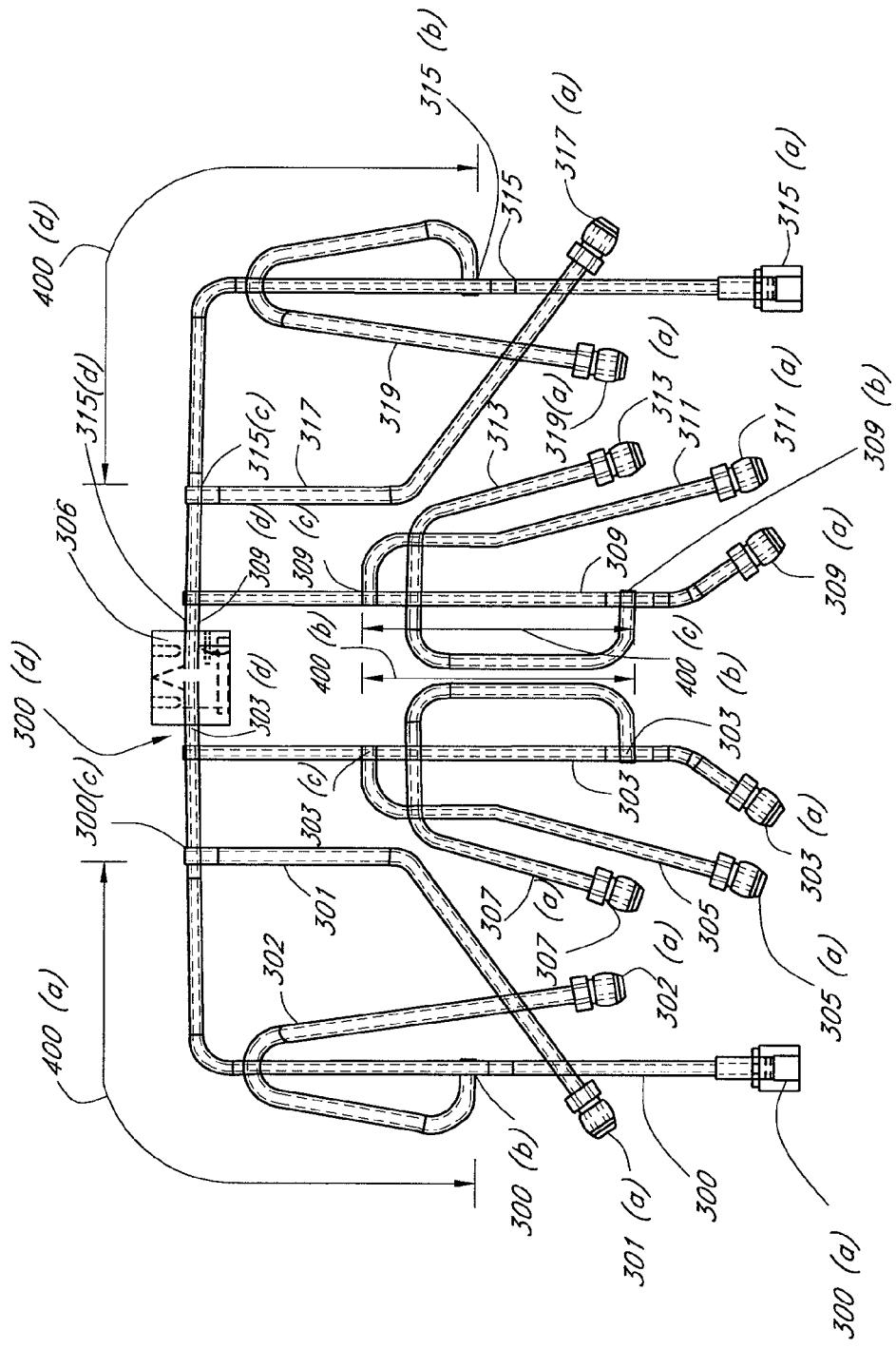
FIG. 4 is a top plan view of the reactant gas lines coupled to an upstream member of the mixer assembly of the gas distribution system from FIG. 3 showing a buffer region in each reactant gas line.

As best seen in FIG. 4, in this example, the plurality of gas lines include four reactant lines 300, 303, 309, 315 and eight buffer lines 301, 302, 305, 307, 311, 313, 317, and 319. Each reactant line is coupled with two of the buffer lines. Reactant line 300 is coupled to buffer lines 301, 302. Reactant line 303 is coupled to buffer lines 305, 307. Reactant line 307 is coupled to buffer lines 311, 313. Reactant line 315 is coupled to buffer lines 317, 319. The gas distribution system 202 can include greater or fewer reactant lines and buffer lines depending on the configuration of the ALD device 100. Moreover, each reactant line may or may not be coupled to two buffer lines. For example, one or more of the reactant lines may be coupled to the buffer lines while another reactant line is not. The reactant line that is not coupled to buffer lines could be shut off by other means.

Each reactant gas line includes four couplings within the gas distribution system 202. Reactant gas line 300 comprises couplings 300(a), 300(b), 300(c), and 300(d). Reactant gas line 303 comprises couplings 303(a), 303(b), 303(c), and 303(d). Reactant gas line 309 comprises couplings 309(a), 309(b), 309(c), and 309(d). Reactant gas line 315 comprises couplings 315(a), 315(b), 315(c), and 315(d). The couplings for each reactant gas line are described below.

Coupling 300(a) couples the reactant gas line 300 with the coupling 102(b) that leads to a reactant source (see FIG. 1B). Coupling 300(b) couples the reactant gas line 300 with the buffer line 302. Coupling 300(c) couples the reactant gas line 300 with the buffer line 301. Coupling 300(d) couples the reactant gas line 300 with the mixer assembly 304.

Coupling 303(a) couples the reactant gas line 303 with the coupling 104(b) that leads to another reactant source (see FIG. 1B). Coupling 303(b) couples the reactant gas line 303 with the buffer line 307. Coupling 303(c) couples the reactant gas line 303 with the buffer line 305. Coupling 303(d) couples the reactant gas line 303 with the mixer assembly 304.

Coupling 309(a) couples the reactant gas line 309 with the coupling 104(c) that leads to another reactant source. (see FIG. 1B). Coupling 309(b) couples the reactant gas line 309 with the buffer line 313. Coupling 309(c) couples the reactant gas line 309 with the buffer line 311. Coupling 309(d) couples the reactant gas line 309 with the mixer assembly 304.

Coupling 315(a) couples the reactant gas line 315 with the coupling source 102(a) that leads to still another reactant source (see FIG. 1B). Coupling 315(b) couples the reactant gas line 315 with the buffer line 319. Coupling 315(c) couples the reactant gas line 315 with the buffer line 317. Coupling 315(d) couples the reactant gas line 315 with the mixer assembly 304.

Buffer lines 301, 302, 305, 307, 311, 313, 317, and 319 comprise couplings 301(a), 302(a), 305(a), 307(a), 311(a), 313(a), 317(a), and 319(a), respectively.

In the embodiment illustrated in FIGS. 3 and 4, each coupling 301(a), 305(a), 311(a), and 317(a) provides a flow path into the gas distribution system 202. The coupling 301(a) couples the buffer line 301 with the coupling 104(a) (see FIG. 1B). The coupling 305(a) couples the buffer line 305 with the coupling 104(b) (see FIG. 1B). The coupling 311(a) couples the buffer line 311 with the coupling 104(c) (see FIG. 1B). The coupling 317(a) couples the buffer line 317 with the coupling 104(d) (see FIG. 1B).

Each coupling 302(a), 307(a), 313(a), and 319(a) provides a flow path between the gas distribution system 202 and the exhaust launder 316 via connectors 320(a)-(d). Connector 320(a) connects coupling 302(a) with the exhaust launder 316. Connector 320(b) connects coupling 307(a) with the exhaust launder 316. Connector 320(c) connects coupling 313(a) with the exhaust launder 316. Connector 320(d) connects coupling 319(a) with the exhaust launder 316. These connections contribute to the operation of inert gas valving (IGV).

In the embodiment shown in FIG. 3, the reactant gas lines 300, 303, 309, and 315 route reactant gases to the mixer assembly 304. The buffer lines 301, 305, 311, and 317 route inert gases to the mixer assembly 304. The resulting mixture (one reactant at a time with an inert gas) flows through a transfer tube 310 to an intake plenum 312. The intake plenum 312 distributes the mixture in a transverse direction with respect to the flow path through the transfer tube 310. The mixture exits the intake plenum 312 into the deposition chamber 200 through the cover plate 314. As shown in FIGS. 2 and 3, the cover plate 314 lies adjacent to the base plate 206 and the two plates form a flow path there between for the mixture to flow over the substrate or wafer placed on the wafer support 204. The base plate 206 and the cover plate 314 have substantially rectangular outer perimeters.

While traversing the deposition chamber 200, the mixture pulse saturates the surface of the substrate. Adsorption or reaction occurs between the current mixture and the surface of the substrate as left by the previous pulse may occur. After passing through the deposition chamber 200, the mixture flows towards the exhaust launder 316. The exhaust launder 316 is configured to collect excess of the mixture and any byproduct after the mixture has saturated the wafer. In an embodiment, a region within the exhaust launder 316 is at a lower pressure than the pressure in the deposition chamber 200. A negative pressure source or vacuum can be in flow communication with the exhaust launder 316 and/or gas exit 106 to draw the mixture from the deposition chamber 200. The exhaust launder 316 is in flow communication with the gas exit 106. The collected mixture exits the deposition chamber 200 via the gas exit 106.

Still referring to FIG. 3, the mixer assembly 304 includes an upstream member 306 and a downstream member 308. The upstream member 306 is in flow communication with the reactant gas lines and the buffer lines. The upstream member 306 is configured to mix the reactant gas with the inert gas prior to the mixture entering the downstream member 308. The downstream member 308 funnels the mixture between the upstream member 306 and the transfer tube 310. As will be described in more detail with reference to FIG. 9, the downstream member 308 is configured to minimize the tendency of the mixture to re-circulate within the downstream member 308 by continually reducing cross-sectional area of the flow path for the mixture.

FIG. 4 is a top plan view of the reactant gas lines coupled to the buffer lines and the upstream member 306 of the mixer assembly. Between couplings 300(c) and 300(b), a buffer region 400(a) is formed in the reactant gas line 300. Between couplings 303(c) and 303(b), a buffer region 400(b) is formed in the reactant gas line 303. Between couplings 309(c) and 309(b), a buffer region 400(c) is formed in the reactant gas line 309. Between couplings 315(c) and 315(b), a buffer region 400(d) is formed in the reactant gas line 315. The buffer lines 301, 305, 311, and 317, which form flow paths into the gas distribution system 202, couple to their associated gas lines downstream of couplings 300(b) 303(b), 309(b), and 315(b). In this way, gas entering via couplings 301(a), 305(a), 311(a), and 317(a) enters the reactant lines 300, 303, 309, 315 downstream of the reactant lines couplings with the buffer lines 302, 307, 311, and 319. Fixed orifices can be placed at couplings 302(a), 307(a), 313(a) and 319(a).

As seen in FIG. 3, couplings 302(a), 307(a), 313(a) and 319(a) are in communication with the exhaust launder 316. The orifices create a higher resistance path for the gases to flow to the exhaust launder 316 and bypass the deposition chamber 200. In this way, during the pulse of a reactant gas, a small portion of the reactant gas entering via couplings 300(a), 303(a), 309(a) or 315(a) bypasses the deposition chamber and flows directly to the exhaust launder 316. The restriction created by the orifice limits the amount of shunted reactant. During the purge step, at least a portion of the inert gas entering via couplings 301(a), 305(a), 311(a), and 317(a) creates a reverse flow towards couplings 300(b) 303(b), 309(b), and 315(b) to form the buffer regions 400(a)-(d) within the reactant gas line. The buffer regions keep the reactant gases from diffusing into the reactor during the purge steps or during reactant flow of a reactant from one of the other reactant lines into the mixer assembly 304.

For example, during an ALD processing step, reactant gas flows through reactant line 300 towards the upstream member 306 of the mixer assembly. A small amount of this reactant gas is diverted to the buffer line 302 and out through coupling 302(a) into the exhaust launder 316. The amount of gas that is diverted to the buffer line is dependent of the size of the fixed orifice at coupling 302(a). The size of the fixed orifice can be changed to divert more or less of the gas into the exhaust launder 316. The remaining reactant gas flows through the buffer region 400(a) to the coupling 300(c).

Inert gas may or may not be introduced through coupling 301(a) to push the reactant gas into the upstream member 306. If inert gas is introduced through coupling 301(a), the inert gas joins the reactant gas at coupling 300(c) and flows to the upstream member 306. After the pulse step, the reactant gas is purged from the gas line. Purging of the gas line can be accomplished by, for example, shutting off the flow of the reactant gas from coupling 300(a) and/or using the inert gas to impede the diffusion of any remaining reactant gas into the upstream member 306. The shutoff valve can be located outside of the heated area and can be used to shut off the flow of the reactant gas. The inert gas can be introduced through coupling 301(a) in an inert gas valving (IGV) process as described generally in U.S. patent publication number 2001/0054377, published on Dec. 27, 2001, the disclosure of which is hereby incorporated herein by reference.

A first portion of the stream of inert gas flow enters the buffer region 400(a) and flows upstream or backwards towards the coupling 300(b). A second portion of the stream of gas flows downstream towards the upstream member 306. The first portion exits the reactant line 300 at the end of the buffer region 400(a) and enters the buffer line 302. While the first portion is flowing through the buffer region 400(a), the remaining reactant gas between the shutoff valve upstream of coupling 300(a) and coupling 300(b) is blocked from flowing or diffusing to the upstream member 306 without subjecting physical valves (which are remote) to the wear caused by high temperatures. The first portion forms a buffer or diffusion barrier (or inert gas valve) that impedes the flow of the reactant gas through the reactant line 300 to the mixer assembly 304. By cycling the shutoff valve upstream of coupling 300(a), the ALD control system is able to control between flowing and not flowing the inert gas in the buffer line 301. In this way, the ALD control system is able to quickly control whether the reactant gas entering the reactant line 300 via coupling 300(a) reaches the upstream member 306. Furthermore, during the purge step and subsequent pulses of other reactant gases, the reactant gas in a "dead space" which is located between the shutoff valve upstream of the coupling 300(a) and coupling 300(b) can be kept from diffusing into the upstream member 306. This may be advantageous for ALD since the different reactant gases are kept separated and only react on the surface of the substrate and not in the gas phase.

Whether the reactant gas entering the gas distribution system 202 via the coupling 303(a) reaches the upstream member 306 is similarly controlled by flowing a gas through the buffer line 305 and into the reactant line 303 at coupling 303(c) and using a shutoff valve upstream of coupling 303(a). A first portion of the gas entering the reactant line at coupling 303(c) forms the buffer 400(b). In this way, the first portion of the gas impedes the reactant gas entering via the reactant line 303 from entering the upstream member 306. A second portion of the gas entering the reactant line at coupling 303(c) flows away from the buffer region 400(b) and towards the upstream member 306.

Whether the reactant gas entering the gas distribution system 202 via the coupling 309(a) reaches the upstream member 306 is similarly controlled by flowing a gas through the buffer line 311 and into the reactant line 309 at coupling 309(c) and using a shutoff valve upstream of coupling 309(a). A first portion of the gas entering the reactant line at coupling 309(c) forms the buffer 400(c). In this way, the first portion of the gas impedes the reactant gas entering via the reactant line 309 from entering the upstream member 306. A second portion of the gas entering the reactant line at coupling 309(c) flows away from the buffer region 400(c) and towards the upstream member 306.

Whether the reactant gas entering the gas distribution system 202 via the coupling 315(a) reaches the upstream member 306 is similarly controlled by flowing a gas through the buffer line 317 and into the reactant line 315 at coupling 315(c) and a shutoff valve upstream of coupling 315(a). A first portion of the gas entering the reactant line at coupling 315(c) forms the buffer 400(d). In this way, the first portion of the gas impedes the reactant gas entering via the reactant line 315 from entering the upstream member 306. A second portion of the gas entering the reactant line at coupling 315(c) flows away from the buffer region 400(d) and towards the upstream member 306.

As mentioned above, the first portions of the gases which enter the gas distribution system 202 via buffer lines 301, 305, 311, and 317 and form the buffer regions 400(a)-(d), exit via buffer lines 302, 307, 313, and 319. The gas exiting via buffer lines 302, 307, 313, and 319 enter the exhaust launder 316 without passing through the deposition chamber 200. In this way, the first portions of the inert gases bypass the deposition chamber 200 and are collected by the exhaust launder 316 downstream of the deposition chamber 200.

As mentioned above, the second portions of each gas which enter the gas distribution system 202 via buffer lines 301, 305, 311, and 317 flow away from the buffer regions 400(a)-(d) and enter the mixer assembly 304. During reactant pulses, the second portions mix with one or more reactant gases from other reactant lines, which reach the mixer assembly 304. Thus, the second portions flow through the deposition chamber 200. Depending on the current ALD processing step, gases may periodically flow through their respective buffer lines 301, 305, 311, and 317.

A reactant gas which the ALD control system desires to reach the deposition chamber 200 flows through its respective reactant line and into the mixer assembly 304. The ALD control system forms buffer regions 400 in the reactant lines associated with the reactant gases which the ALD control system does not want to reach the deposition chamber 200.

The reactant gas which flows through the reactant line which does not have a buffer region 400 mixes with the second portions of the one or more inert gases which are simultaneously flowing through the other reactant lines and into the mixer assembly 304. As explained above, the first portions of these gases form buffer regions in the other reactant lines and bypass the deposition chamber 200.

In one embodiment of the ALD device 100 which comprises four reactant gas lines, each reactant gas alternates in reaching the mixer assembly 304. In this embodiment the reactant gas selected by ALD control system flows into the mixer assembly 304 while inert or "buffer" gas flows in the remaining three reactant lines. Continuing with this embodiment, the second portions of the gases flowing away from the buffer regions enter the mixer assembly 304. The reactant gas of the pulse of interest then mixes with the inert gas of the second portions in the mixer assembly 304. The mixer assembly 304 will be described in detail with reference to FIGS. 5-8.

FIG. 5A is a rear view of the upstream member 306 from FIG. 4 that illustrates a circular flow path 504 through the upstream member 306. FIG. 5B is a cross-sectional view taken along line A-A of FIG. 5A. As illustrated in FIG. 5B, the upstream member 306 includes a housing 500 and an insert section 502. The housing 500 can have a square exterior shape with a non-tapered, cylindrical section (illustrated as 518) and tapered, conical section (illustrated as 520) extending therethrough. A narrowing conical inner surface 503 on the inside diameter of the housing 500 narrows in a downstream direction towards the deposition chamber 200. The inner surface 503 of the upstream member 306 forms an upstream member housing mixing surface 516. The upstream member 306 can be made of one piece or separate pieces.

The housing 500 further includes inner gas inlets 600(a) and 600(b) and outer gas inlets 602(a) and 602(b). The inner gas inlets 600(a) and 600(b) and the outer gas inlets 602(a) and 602(b) are in flow communication with the reactant lines 300, 303, 309, and 315 (see FIG. 4). The inner gas inlet 600(a) connects with the reactant line 300 at coupling 300(d). The inner gas inlet 600(b) connects with the reactant line 315 at coupling 315(d). The outer gas inlet 602(a) connects with the reactant line 303 at coupling 303(d). The outer gas inlet 602(b) connects with the reactant line 309 at coupling 309(d). The inner gas inlets 600(a) and 600(b) and the outer gas inlets 602(a) and 602(b) in FIG. 5A extend through the housing 500 in a direction at an angle to the axis of flow 505 preferably at a greater than 45 degree and in the illustrated embodiment at 90 degrees to the flow axis 505 and parallel to but offset from a centerline 508. The inner gas inlets 600(a) and 600(b) and the outer gas inlets 602(a) and 602(b) can have elements of symmetry with respect to the centerline 508. As illustrated in FIG. 5A, the inner gas inlets 600(a) and 600(b) are located between the centerline 508 and the outer gas inlets 602(a) and 602(b). The outer gas inlets 602(a) and 602(b) can be located to provide tangential in-flow into the upstream member 306.

The insert section 502 can comprise a cone portion 506 or other three dimensional geometric shape. For example, a pyramid shape, parabolic shape, hemispherical shape, or combination of one or more shapes could be used. For example, a combination of a hemispherical base with a pyramid shape top could be used for the insert portion 502. The illustrated cone portion 506 includes a base 510 and a distal end 512. The conical surface or cone portion 506 extends from the base 510 of the insert in a downstream direction towards the distal end 512. A circumference of the cone portion 506 at the distal end 512 is less than a circumference of the base 510. In this way, the geometric shape of the insert section 502 narrows or tapers in a downstream direction towards the deposition chamber 200.

A surface of the cone portion 506 forms an insert mixing surface 514. The insert mixing surface 514 extends between the base 510 and the distal end 512. In the embodiment depicted in FIG. 5B, nearly all of the insert mixing surface 514 is parallel to the upstream member housing mixing surface 516. Alternatively, the insert mixing surface 514 and the upstream member housing mixing surface 516 may not be parallel. For example, the insert mixing surface 514 could have a pyramid shape while the upstream member housing mixing surface 516 could have a conical shape but preferably both surfaces are smooth. In any case, the outer surface of the insert and the inner surface of the housing preferably define a passage therebetween and the passage preferably is annular about the mixer flow axis 505. Furthermore, the passage preferably is defined by tapering surfaces to form a funnel.

Surface 507 of the insert 502 can be formed to match the radius of the intersecting inner gas inlets 600(a) and 600(b) and the outer gas inlets 602(a) and 602(b). For example, the surface 507 can be in the shape of a trough which circumscribes the base 510. A cross-section of the trough matches the radius of the outer gas inlets 602(a) and 602(b). The surface 507 forms a transition surface between the insert mixing surface 514 and the upstream member housing mixing surface 516. In this way, turbulence and recirculation can be reduced in the upstream member 306. The annular passage thus serves as a mixing chamber between the downstream member 308 (see FIG. 3), the insert mixing outer surface 514, housing mixing inner surface 516, and the surface 507.

The cone portion 506 reduces gas recirculation in the center of the upstream member 306. Since the housing mixing surface 516 narrows in a downstream direction towards the deposition chamber 200, the distance between the outside surface of the cone portion 506 and the inner conical surface of the housing 500 can be parallel. The parallel surfaces allow a linear decrease in the cross-sectional area as traced by the flow path through the upstream member 306.

A racetrack region or annular passage 504 is formed between the outside surface of the cone portion 506 and the inner conical surface of the housing 500. Due to the offset locations of the inner gas inlet 600(a) and 600(b) and the outer gas inlets 602(a) and 602(b) with respect to the centerline 508, the reactant gas and any second portions of the gases from the buffer lines enter the annular passage 504 at different locations. For example, the outer gas inlets 602(a) and 602(b) are substantially aligned with a cross-section of the trough which circumscribes the base 510. By entering the annular passage 504 at different locations, the gases follow the annular passage and swirl around the cone portion 506 as the gases move through the upstream member 306 and towards the deposition chamber 200. The annular passage 504 enhances the mixing of the reactant gas with the second portions of the inert gases within the upstream member 306. In this way, the upstream member 306 mixes the gases in three dimensions. Additionally, as the cross-sectional area between the housing 500 and the insert 502 decreases as the mixture moves towards the downstream member 308 (see FIG. 3), the velocity of the mixture increases. This increase in mixture velocity aids in the mixing process.

FIG. 6A is a front view of the upstream member 306 showing the inner gas inlets 600(a) and 600(b) and the outer gas inlets 602(a) and 602(b). FIGS. 6B and 6C are side views of the upstream member 306. The inner gas inlets 600(a) and 600(b) and the outer gas inlets 602(a) and 602(b) are in flow communication with the reactant gas lines shown in FIG. 4. The inside surfaces of the insert 502 and the housing 500 are shown in phantom lines.

FIG. 7A is a rear view of the housing 500 from FIG. 5A with the insert 502 removed. FIG. 7B is a cross-sectional view taken along line C-C of FIG. 7A. The housing 500 can have a square exterior shape with a partially cylindrical and partially conical cavity extending therethrough. A narrowing conical surface on the inside diameter of the housing 500 extends in a downstream direction towards the deposition chamber 200. The housing 500 further includes attachment holes 700(a)-(d) on the downstream or rear surface for attaching the upstream member 306 to the downstream member 308 (see FIG. 3).

FIG. 8A is a front view of the insert 502 from FIG. 5A. FIG. 8B is a cross-sectional view taken along line B-B of FIG. 8A and illustrates a spiral flow path 800 around a cone portion 506 of the insert. As illustrated, the gas mixture circles around the cone 506 (through the frustoconical passage) as the mixture migrates towards the deposition chamber 200.

Figure 9B:
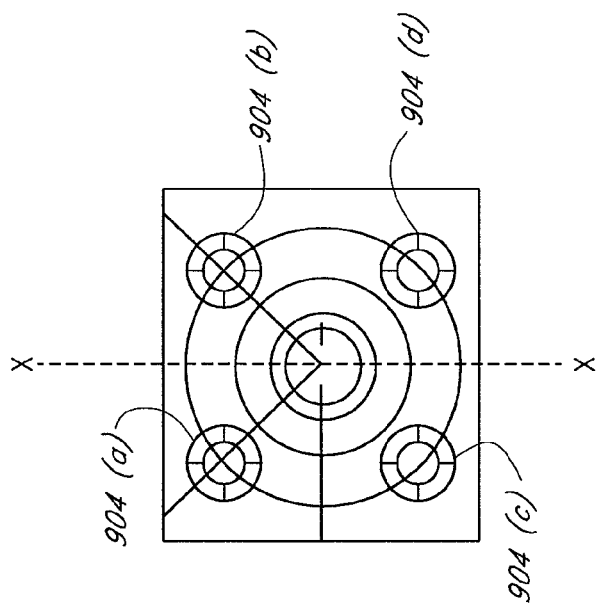
FIG. 9B is a cross-sectional view taken along line X-X of FIG. 9A, illustrating a reduction in the open cross-section area as the mixture flows through the downstream member.
Figure 9A:
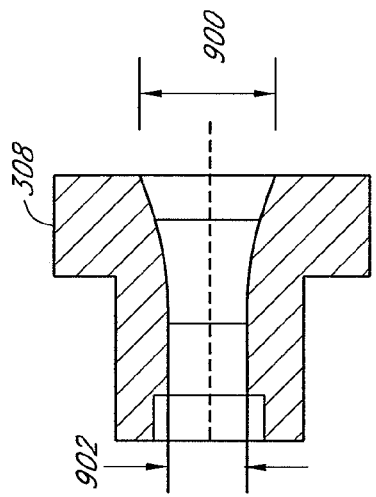
FIG. 9A is a rear view of a downstream member of the mixer assembly (shown attached to the upstream member in FIG. 3).

FIG. 9A is a rear view of the downstream member 308 of the mixer assembly 304 from FIG. 3. FIG. 9B is a cross-sectional view taken along line X-X of FIG. 9A illustrating a reduction in the open cross-section area as the mixture flows through the downstream member. In FIGS. 9A and 9B, the upstream member 306 is not shown. The downstream member 308 has a general funnel shape along an inside surface. The downstream member 308 includes a downstream member entrance 900 and a downstream member exit 902. The cross-sectional area of the downstream member entrance 900 is greater than the cross-sectional area of the downstream member exit 902. In some embodiments, the cross-sectional flow area of the downstream member 308 gradually decreases as the mixture migrates towards the downstream member exit 902 to form a tapered or "funnel" passage therebetween. The downstream member 308 further includes attachment holes 904(a)-(d). The attachment holes 904(a)-(d) align with the attachment holes 700(a)-(d) (see FIG. 7A) for attaching the upstream member 306 to the downstream member 308. Controlling the machining tolerances on the attachment holes 904(a)-(d) can aid in aligning the upstream member 306 with the downstream member 308 thereby reducing recirculation within the mixer assembly 304. Controlling the surface finish and flatness on the mating surfaces of the upstream member 306 (see FIGS. 5A and 5B) and the downstream member 308 can aid in sealing the upstream member with the downstream member. In one embodiment, a 16 micro finish surface is maintained.

FIG. 10A is bottom view of the transfer tube 310 and the intake plenum 312 from FIG. 3 illustrating the gas entering the transfer tube and exiting from the intake plenum. FIG. 10B is a front view of the transfer tube 310 and the intake plenum 312 from FIG. 3. FIG. 10C is a top view of the transfer tube 310 and the intake plenum 312 from FIG. 3. The transfer tube 310 connects with the downstream member 308 (see FIG. 9A). The mixture flows from the mixer assembly 304 into the transfer tube 310 via an intake plenum entrance 1000 before entering the intake plenum 312. The mixture is then distributed in the intake plenum 312 prior to the mixture exiting the intake plenum 312 via intake plenum exits 1002. Returning to FIG. 3, once the mixture exits the intake plenum 312 via the intake plenum exits 1002, the mixture passes through the cover plate 314 whereby it enters the deposition chamber 200.

Figure 11:
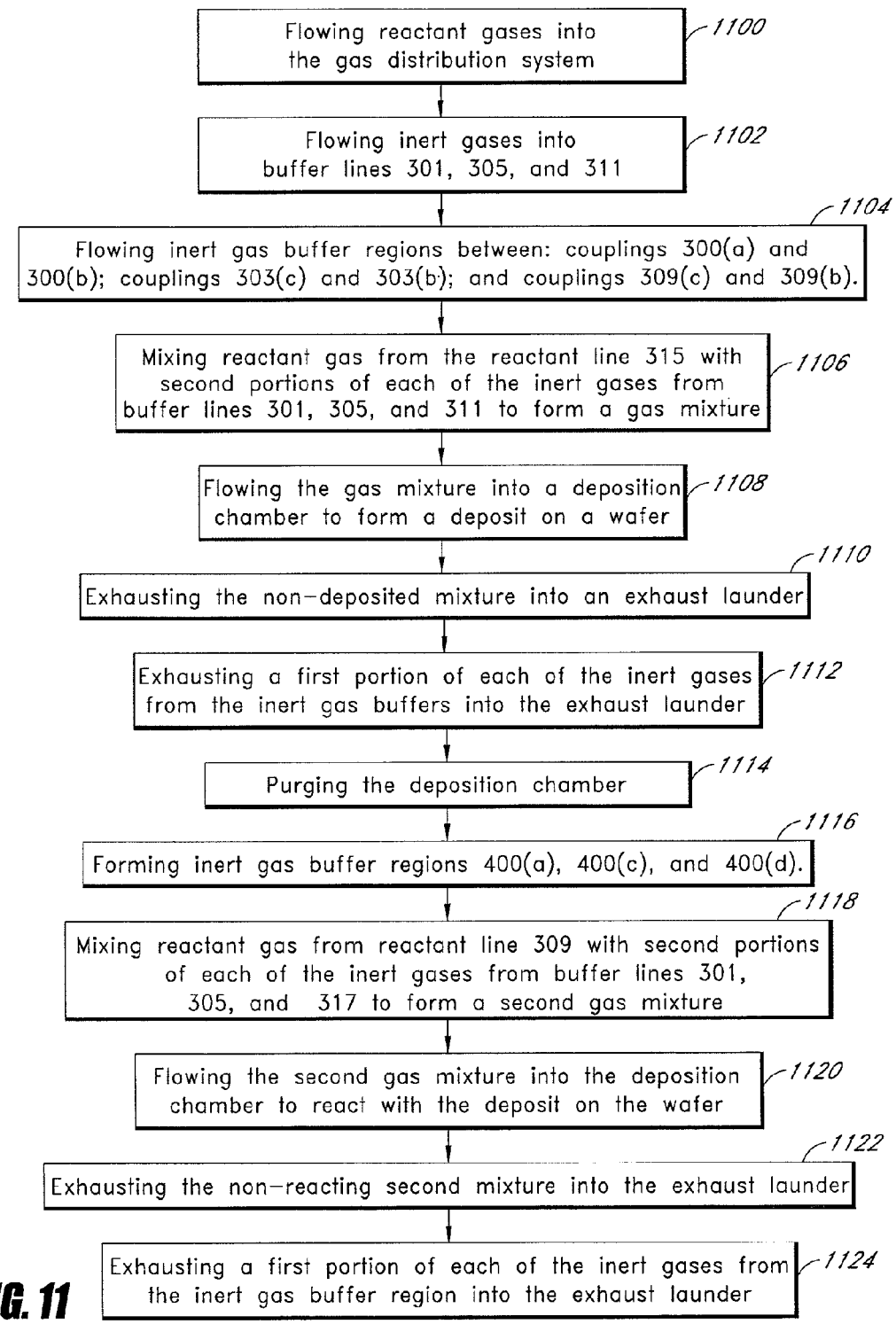
FIG. 11 is a flow diagram illustrating a process for atomic layer deposition.

FIG. 11 is a flow diagram illustrating a process for atomic layer deposition. The order of the states in FIG. 11 is exemplary only. In this exemplary process, only the reactant gas entering via reactant line 315 is selected for entering the deposition chamber 200. The process begins at a state 1100 where one or more reactant gases flow into the gas distribution system 202 via couplings 300(a), 303(a), 309(a), and 315(a) (see FIGS. 3 and 4). The reactant gas flows through its respective reactant line gas line 300(a), 303(a), 309(a), and 315(a) and towards the mixer assembly 304. Flow proceeds to a state 1102 where one or more inert gases flow into buffer lines 301, 305, and 311 via couplings 301(a), 305(a), and 311(a). The process moves to a state 1104 where buffer regions 400(a)-(c) are formed between couplings 300(c) and 300(b), 303(c) and 303(b), and 309(c) and 309(b). In this way, the only reactant gas that reaches the mixer assembly 304 is the reactant gas entering via coupling 315(a) and flows through reactant line 315. The inert gases forming buffer regions 400(a)-(c) prevent the reactant gases entering via couplings 300(a), 303(a), and 309(a) from reaching the mixer assembly 304. Alternatively, the buffer regions are formed before the reactant gas flows towards the mixer assembly 304. Moreover, one or more buffer regions can be formed before one or more of the reactant gases flows towards the mixer assembly 304.

The process moves to a state 1106 where the reactant gas from the reactant line 315 is mixed with second portions of each of the inert gases entering via buffer lines 301, 305, and 311. The reactant gas and the second portions of the inert gases form a gas mixture in the mixer assembly 304. Each of the gases enters the mixer assembly at different locations around the circumference of the mixer assembly 304. The entering gases swirl around the cone portion 506 (see FIG. 5A) as the gas passes through the mixer assembly 304. Further, the cross-sectional area in the mixer assembly decreases as the mixture flows through the mixer assembly 304 and towards the transfer tube 310.

The process continues to a state 1108 where the gas mixture flows into a deposition chamber 200 to adsorb or otherwise react on a substrate. The process moves to a state 1110 where excess mixture and any by-product are exhausted into an exhaust launder 316. The process proceeds to a state 1112 where a first portion of each of the inert gases from the inert buffer regions 400(a)-(c) exhausts into the exhaust launder 316 via buffer lines 302, 307, and 313. Flow continues to a state 1114 where the deposition chamber 200 is purged.

Flow moves to a state 1116 where a different set of inert gas buffer regions 400 are formed in the gas distribution system 202. In the exemplary process described with respect to FIG. 11, the next desired reactant gas enters the gas distribution system 202 via coupling 309(a). Since only the reactant gas entering via coupling 309(a) is desired, in the present example, inert gas buffer regions 400(a), 400(c), and 400(d) are formed by flowing gas through the buffer lines 301, 305, and 311. Next, at a state 1118, the reactant gas entering via coupling 309(a) flows through reactant line 309 and mixes with second portions of each of the inert gases. The second portions of the inert gases enter the reactant lines at couplings 300(c), 303(c), and 315(c) and flow towards the mixer assembly 304. In the mixer assembly 304, the second portions form a second gas mixture with the reactant gas entering via reactant line 309.

The process moves to a state 1120 where the second gas mixture flows into the deposition chamber 200 to react with the deposit on the wafer. Next, at a state 1122, the excess second mixture and any by-product is exhausted into the exhaust launder 316. The process moves to a state 1124 where a first portion of each of the inert gases from the inert gas buffer regions 400(a), 400(c), and 400(d) are exhausted into the exhaust launder 316. The first portion is exhausted to the exhaust launder 316 without passing through the mixer assembly 304.

Advantageously, one or more of the disclosed features lend themselves to improve mixing during ALD processing. Furthermore, the construction of the mixer lends itself to ready disassembly, cleaning and replacement of any "pre-reaction product." The use of a pre-reaction chamber arranged upstream of the deposition or reactor chamber to reduce the residue of a preceding reactant during ALD processing is disclosed in U.S. patent publication number 2002/0108570, published on Aug. 15, 2002, the disclosure of which is incorporated herein by reference.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention.

What is claimed is:

1. A method of performing atomic layer deposition (ALD) in a deposition chamber, the method comprising:
forming a first gas buffer in a first gas line so as to prevent a first gas from reaching a housing, the housing having a first generally tapered surface to form a mixing chamber therein, wherein the first gas is selectively flowable into the mixing chamber;
flowing a second gas through a second gas line and into the mixing chamber while the first gas buffer is formed;
mixing the second gas with a third gas in the mixing chamber to form a first gas mixture;
swirling the first gas mixture in the mixing chamber;
flowing the first gas mixture into a deposition chamber; and
contacting a substrate in the deposition chamber with at least a portion of the first gas mixture.

2. The method of claim 1 further comprising, after contacting:
purging an unused portion of the first gas mixture from the deposition chamber.

3. The method of claim 1 further comprising, after contacting the substrate with the first gas mixture:
forming a second gas buffer in the second gas line so as to prevent the second gas from reaching the mixing chamber;
flowing the first gas through the first gas line and into the mixing chamber while the second gas buffer is formed;
mixing the first gas with the third gas in the mixing chamber to form a second gas mixture;
swirling the second gas mixture in the mixing chamber;
flowing the second gas mixture into the deposition chamber;
contacting the substrate in the deposition chamber with at least a portion of the second gas mixture; and
purging an unused portion of the second gas mixture from the deposition chamber.

4. The method of claim 1, wherein flowing the second gas through the second gas line and into the mixing chamber further comprises introducing the second gas into the mixing chamber at an angle of at least 45 degrees relative to a flow axis.

5. The method of claim 1, wherein flowing the second gas through the second gas line and into the mixing chamber further comprises introducing the second gas into the mixing chamber at an angle of 90 degrees relative to a flow axis.

6. A method of performing atomic layer deposition (ALD) in a deposition chamber, the method comprising:
providing a housing having a flow axis, an inner surface defining a mixing chamber, a first cross-sectional area of the mixing chamber substantially perpendicular to the flow axis, and a second cross-sectional area of the mixing chamber substantially perpendicular to the flow axis, wherein the flow axis is an axis along which gases exit the mixing chamber, and wherein the second cross-sectional area is disposed downstream of the first cross-sectional area and is smaller than the first cross-sectional area;
introducing a first gas into the mixing chamber at a first angle relative to the flow axis;
introducing a second gas into the mixing chamber at a second angle relative to the flow axis;
preventing a third gas that is selectively flowable into the mixing chamber from entering the mixing chamber;
mixing the second gas and the first gas in the mixing chamber in the absence of the third gas to form a first gas mixture; and
flowing the first gas mixture of the first gas and the second gas out of the mixing chamber along the flow axis and into a deposition chamber;
contacting a wafer disposed in the deposition chamber with a portion of the first gas mixture; and
exhausting an unused portion of the first gas mixture from the deposition chamber.

7. The method of claim 6 further comprising swirling the first gas and the second gas in the mixing chamber and around the flow axis.

8. The method of claim 6, wherein the first angle is 90 degrees.

9. The method of claim 6, wherein the first angle is at least 45 degrees.

10. The method of claim 6, wherein the second angle is 90 degrees.

11. The method of claim 6, wherein the second angle is at least 45 degrees.

12. The method of claim 6, wherein the first angle is the same as the second angle.

13. The method of claim 6 further comprising:
purging the deposition chamber while exhausting the unused portion of the mixture;
stopping introduction of the first gas into the mixing chamber while purging the deposition chamber;
subsequent to stopping introduction of the first gas, introducing the third gas into the mixing chamber and mixing with the second gas in the absence of the first gas to form a second gas mixture; and
flowing the second gas mixture of the third gas and the second gas out of the mixing chamber along the flow axis and into the deposition chamber;
contacting the wafer with a portion of the second gas mixture; and
exhausting an unused portion of the second gas mixture from the deposition chamber.

14. The method of claim 6, wherein the mixing chamber is outside the deposition chamber.

15. A method for mixing pulses of gas for use during atomic layer deposition (ALD), the method comprising:
providing a housing having a first mixing surface and an opposing second mixing surface, wherein the first and second mixing surfaces form an annular passage therebetween about a flow axis, the flow axis being formed along an axis from which gases exit the housing, and wherein at least a first reactant gas, a second reactant gas, and a buffer gas are selectively flowable into the annular passage;

introducing the first reactant gas into the annular passage perpendicular to the flow axis;

introducing the first buffer gas into the annular passage perpendicular to the flow axis;

mixing the first buffer gas and the first reactant gas in the housing in the absence of further reactants to form a first mixture; and flowing the first mixture of the first reactant gas and the first buffer gas out of the housing along the flow axis; and contacting a wafer with at least a portion of the first mixture.

16. The method of claim 15, further comprising swirling the first reactant gas and the first buffer gas in the annular passage and around the flow axis.

17. The method of claim 16, wherein swirling the first reactant gas and the first buffer gas in the housing and around the flow axis further comprises flowing the mixture in a channel, the channel being at least partially defined by first and second mixing surfaces and a trough forming a transition surface between the first and second mixing surfaces.

18. The method of claim 15, further comprising flowing the first mixture into a deposition chamber housing the wafer.

19. The method of claim 18, further comprising:

exhausting an unused portion of the first mixture from the deposition chamber; and purging the deposition chamber.

20. The method of claim 15, further comprising:

stopping introduction of the first reactant gas into the annular passage;

introducing a second reactant gas into the annular passage perpendicular to the flow axis while the first reactant gas is stopped;

introducing a second buffer gas into the annular passage perpendicular to the flow axis;

mixing the second reactant gas and the second buffer gas in the housing in the absence of further reactants to form a second mixture; and flowing the second mixture of the second reactant gas and the second buffer gas out of the housing; and reacting the second mixture with a surface of the wafer left by the first ALD reaction.

* * * * *